United States Patent
Kamiya

[19]

[11] Patent Number: 6,118,311
[45] Date of Patent: Sep. 12, 2000

[54] OUTPUT CIRCUIT CAPABLE OF SUPPRESSING BOUNCE EFFECT

[75] Inventor: Hiroshi Kamiya, Tokyo, Japan

[73] Assignee: NEC Corporation, Tokyo, Japan

[21] Appl. No.: 09/281,068

[22] Filed: Mar. 9, 1999

[30] Foreign Application Priority Data

Mar. 10, 1998 [JP] Japan .................................. 10-058243

[51] Int. Cl.[7] ............................. H03B 1/00; H03K 17/16
[52] U.S. Cl. ........................... 327/112; 327/379; 327/391
[58] Field of Search ....................... 326/26, 27; 327/108, 327/110, 111, 112, 170, 379–381, 389, 437, 391

[56] References Cited

U.S. PATENT DOCUMENTS

| | | | |
|---|---|---|---|
| 5,410,189 | 4/1995 | Nguyen | 327/170 |
| 5,723,992 | 3/1998 | Yin et al. | 327/112 |
| 5,828,246 | 10/1998 | Bostica et al. | 327/108 |
| 6,043,691 | 3/2000 | Johnson et al. | 327/112 |

FOREIGN PATENT DOCUMENTS

| | | |
|---|---|---|
| 57-176437 | 10/1982 | Japan . |
| 57-203122 | 12/1982 | Japan . |
| 58-78221 | 5/1983 | Japan . |
| 58-142418 | 8/1983 | Japan . |
| 58-182737 | 10/1983 | Japan . |
| 1-163812 | 6/1989 | Japan . |
| 1-304518 | 12/1989 | Japan . |
| 3-250813 | 11/1991 | Japan . |
| 4-618 | 1/1992 | Japan . |
| 6-35582 | 2/1994 | Japan . |
| 7-334281 | 12/1995 | Japan . |
| 8-251000 | 9/1996 | Japan . |
| 9-121148 | 5/1997 | Japan . |

Primary Examiner—Toan Tran
Attorney, Agent, or Firm—Sughrue, Mion, Zinn, Macpeak & Seas, PLLC

[57] ABSTRACT

In an output circuit including first and second power supply terminals, an input terminal, an output terminal, a first switching element connected between the first power supply terminal and the output terminal and being controlled by an input voltage at the input terminal, and a plurality of second switching elements connected in parallel between the output terminal and the second power supply terminal and being controlled by the input voltage, a third switching element is connected between the output terminal and one of the second switching elements, and a control circuit is rat provided for controlling the third switching element in accordance with an output voltage at the output terminal.

32 Claims, 17 Drawing Sheets

OUTPUT CIRCUIT CAPABLE OF SUPPRESSING BOUNCE EFFECT

BACKGROUND OF THE INVENTION

1. Field of the Invention

The present invention relates to an output circuit used in an integrated circuit (IC) device.

2. Description of the Related Art

In an IC device such as a aetal oxide semiconductor (MOS) device, a prior art output circuit is constructed by a P-channel MOS transistor connected between a power supply terminal and an output terminal and at least two N-channel MOS transistors connected between the output terminal and a ground terminal. The transistors are controlled by an input voltage. This will be explained later in detail.

In the above-described prior art output circuit, however, the power supply bounce and/or ground bounce is large. That is, when the input voltage is switched from high to low or vice versa, the output voltage at the output terminal is switched from low to high or vice versa. In such a transition state, the fall speed and rise speed of the output voltage depends upon not only the characteristics of the transistors, but also an external load connected to the output terminal. When the output voltage falls or rises, a current flows from the external load or into the external load, so that currents flowing through a power supply line and a ground line also change. This induces a power supply bounce or a ground bounce due to the inductance of the power supply line and the ground line. As a result, the noise phenomenon of the output voltage caused by the power supply bounce and the ground bounce generates error signals.

In order to suppress the power supply bounce and the ground bounce, one approach is to change the location of pins of the power supply line and the ground line and decrease the length of the pins, thus reducing the inductance of the power supply line and the ground line. However, in this case, if the number of loads connected to the IC device is increased due to the increase of number of data lines, and also the rate of clock signals is increased, the above-mentioned power supply bounce and ground bounce are remarkably increased.

SUMMARY OF THE INVENTION

It is an object of the present invention to suppress the power supply bounce and/or the ground bounce in an output circuit.

According to the present invention, in an output circuit including first and second power supply terminals, an input terminal, an output terminal, a first switching element connected between the first power supply terminal and the output terminal and being controlled by an input voltage at the input terminal, and a plurality of second switching elements connected in parallel between the output terminal and the second power supply terminal and being controlled by the input voltage, a third switching element is connected between the output terminal and one of the second switching elements, and a control circuit is provided for controlling the third switching element in accordance with an output voltage at the output terminal.

Thus, the third switching element is operated, so that the change of the output voltage from a voltage at the first power supply terminal to a voltage at the second power supply terminal is first relatively rapid and then relatively slow.

BRIEF DESCRIPTION OF THE DRAWINGS

The present invention will be more clearly understood from the description as set forth below, as compared with the prior art, with reference to the accompanying drawings, wherein.

FIGS, 13, 14, 15 and 16 are circuit diagrams illustrating fifth, sixth, seventh and eighth embodiments, respectively, of the output circuit according to the present invention.

DESCRIPTION OF THE PREFERRED EMBODIMENTS

Before the description of the preferred embodiments, a prior art output circuit will be explained with reference to FIGS. 1 and 2.

Figure 1:
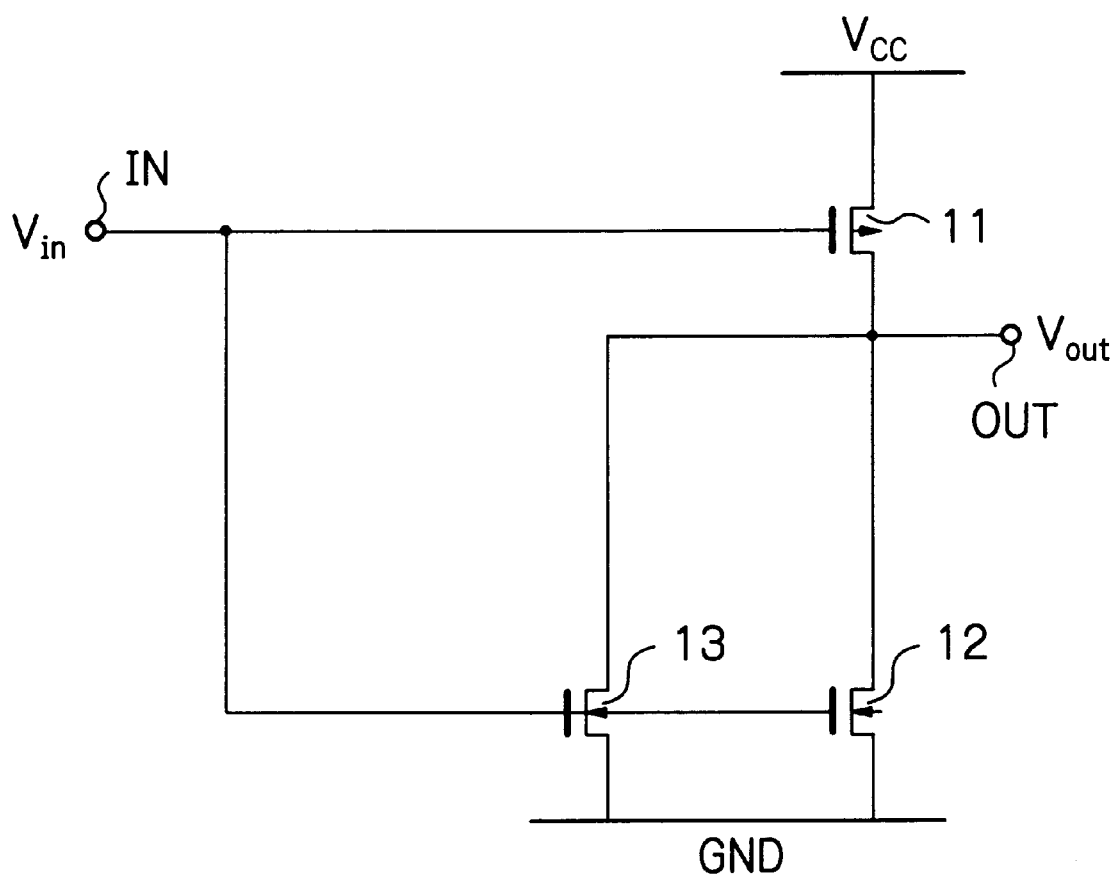
FIG. 1 is a circuit diagram illustrating a prior art output circuit.
Figure 1:
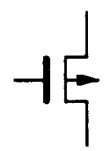
Figure 1:
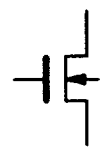

In FIG. 1, which illustrates a prior art output circuit used in an integrated circuit (IC) device, a P-channel MOS transistor 1 is connected between a power supply terminal $V_{CC}$ whose voltage is 3V or 5V, for example, and an output terminal OUT, and two N-channel MOS transistors 2 and 3 are connected in parallel between the output terminal OUT and a ground terminal GND. The gates of the transistors 11, 12 and 13 are controlled by an input voltage $V_{in}$ at an input terminal IN.

When the input voltage $V_{in}$ is high ($=V_{CC}$), the P-channel MOS transistor 11 is turned OFF while the N-channel MOS transistors 12 and 13 are turned ON. As a result, an output voltage $V_{out}$ at the output terminal OUT is low (=GND). On the other hand, when the input voltage $V_{in}$ is low (=GND), the P-channel MOS transistor 11 is turned ON while the N-channel MOS transistors 12 and 13 are turned OFF. As a result, the output voltage $V_{out}$ at the output terminal OUT is high ($=V_{CC}$).

Figure 2A:
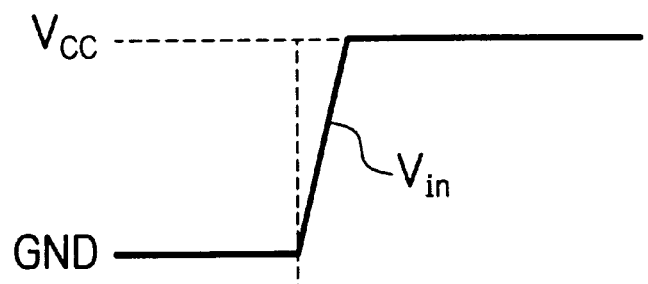
FIGS. 2A and 2B are timing diagrams showing the operation of the output circuit of FIG. 1.
Figure 2B:
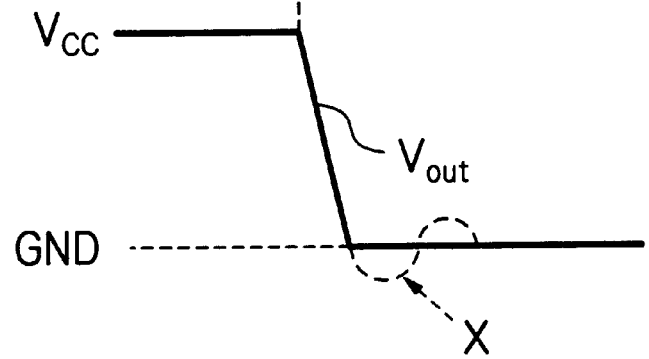

Therefore, when the input voltage $V_{in}$ is switched from low to high as shown in FIG. 2A, the output voltage $V_{out}$ is switched from high to low as shown in FIG. 2B. On the other hand, when the input voltage $V_{in}$ is switched from high to low, the output voltage $V_{out}$ is switched from low to high. In such a transition state, the fall speed and rise speed of the output voltage $V_{out}$ depends upon not only the characteristics of the transistors 11, 12 and 13, but also an external load connected to the output terminal OUT. That is, when the output voltage $V_{out}$ falls or rises, a current flows from the external load or into the external load, so that currents flowing through a power supply line and a ground line also change.

The change of above-mentioned currents flowing through the power supply line and the ground line induces a power supply bounce or a ground bounce due to the inductance of the power supply line and the ground line. Note that the ground bounce can be observed as indicated by a dotted line in FIG. 2B. The noise phenomenon of the output voltage $V_{out}$ the power supply bounce and the ground bounce generate error signals.

In order to suppress the power supply bounce and the ground bounce, one approach is to change the location of pins of the power supply line and the ground line and decrease the length of the pins, thus reducing the inductance of the power supply line and the ground line.

In the above-mentioned approach, however, if the number of loads connected to the IC device is increased due to the increase of number of data lines, and also the rate of clock signals is increased, the above-mentioned power supply bounce and ground bounce are remarkably increased.

Figure 3:
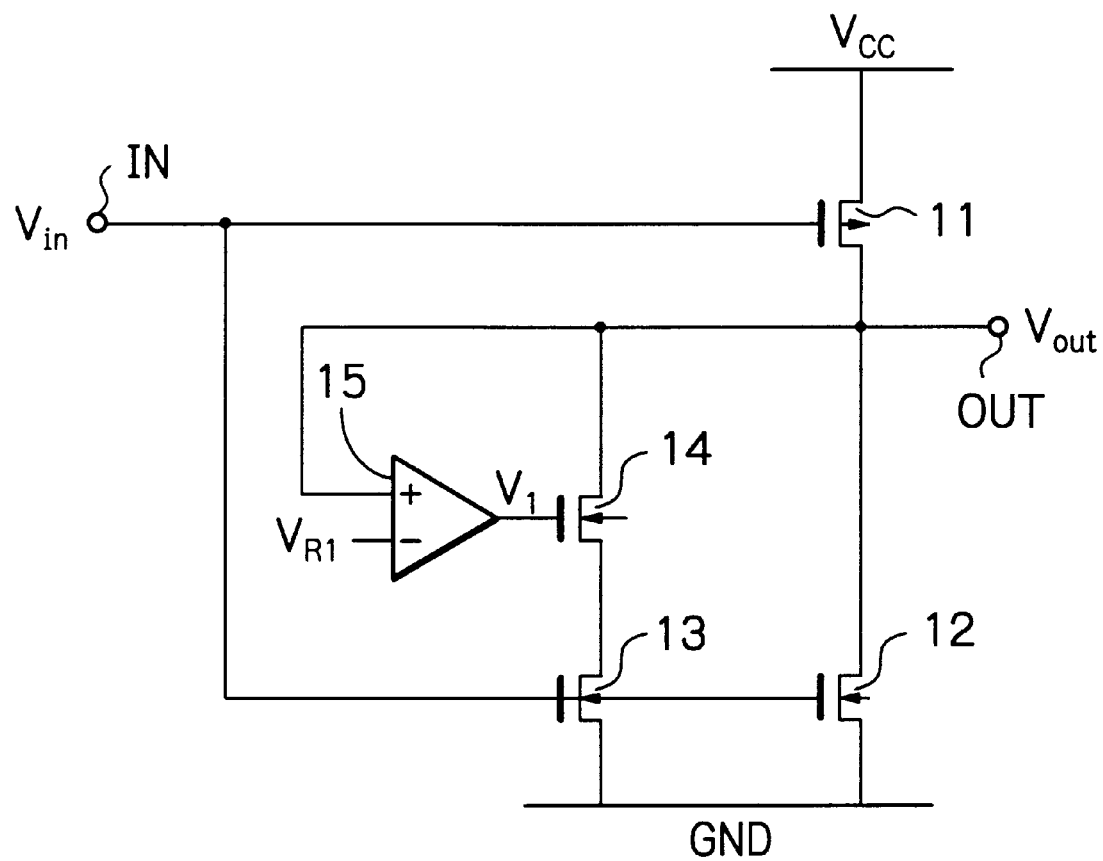
FIG. 3 is a circuit diagram illustrating a first embodiment of the output circuit according to the present invention.

In FIG. 3, which illustrates a first embodiment of the present invention, an N-channel MOS transistor 14 and a comparator 15 are added to the elements of FIG. 1. The N-channel MOS transistor 14 is connected between the output terminal OUT and the drain of the N-channel MOS transistor 13. The comparator 15 generates an output voltage $V_1$ to control the N-channel MOS transistor 14 in accordance with the output voltage $V_{out}$.

In the comparator 15, when the output voltage $V_{out}$ is higher than a reference voltage $V_{R1}$ such as $V_{CC}/2$, the output voltage $V_1$ is high. On the other hand, when the output voltage $V_{out}$ is not higher than the reference voltage $V_{R1}$, the output voltage $V_1$ is low.

The operation of the output circuit of FIG. 3 will be explained next with reference to FIGS. 4A, 4B and 4C.

Figure 4A:
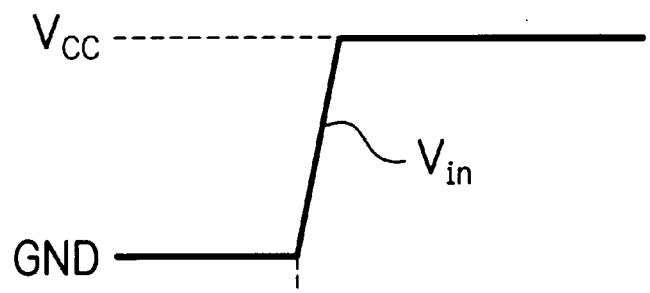
FIGS. 4A, 4B and 4C are timing diagrams showing the operation of the output circuit of FIG. 3.

Before time $t_1$ the input voltage $V_{in}$ is low (=GND) as shown in FIG. 4A. Therefore, the P-channel MOS transistor 11 is turned ON while the N-channel transistors 12 and 13 are turned OFF. As a result, the output voltage $V_{out}$ is high (=$V_{CC}$) as shown in FIG. 4B. In this case, $V_{out}>V_{R1}$, so that the output voltage $V_1$ of the comparator 15 is high (=$V_{CC}$), as shown in FIG. 4C, which turns ON the N-channel MOS transistor 14.

Next, at time $t_1$, the input voltage $V_{in}$ rises as shown in FIG. 4A. Therefore, the N-channel MOS transistors 12 and 13 are turned ON while the P-channel MOS transistor 11 is be turned OFF. In this case, the N-channel transistor 14 is still turned ON since the output voltage $V_1$ shows a high level before the output voltage $V_{out}$ reaches $V_{R1}$, as shown in FIGS. 4B and 4C. As a result, the output voltage $V_{out}$ falls relatively quickly as shown in FIG. 4B.

Figure 4B:
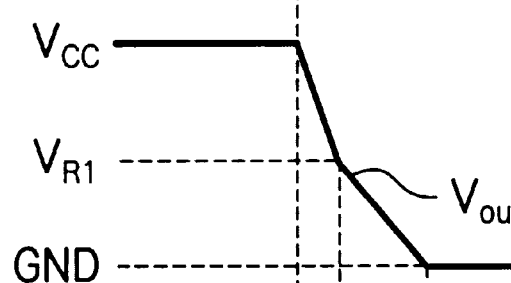
Figure 4C:
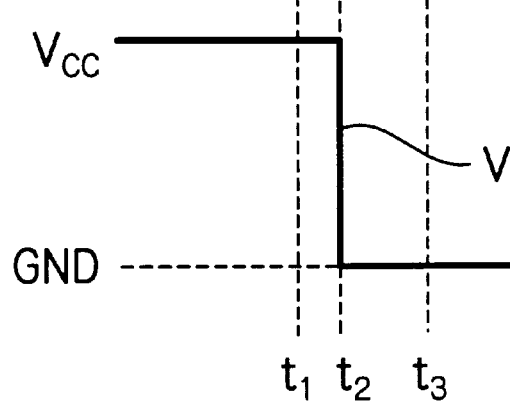

Next, at time $t_2$, the output voltage $V_{out}$ reaches $V_{R1}$ as shown in FIG. 4B, so that the output voltage $V_1$ of the comparator 15 shows a low level as shown in FIG. 4C. Therefore, the N-channel MOS transistor 14 is turned OFF. As a result, the output voltage $V_{out}$ falls relatively slowly as shown in FIG. 4B.

Finally, at time $t_3$, the output voltage $V_{out}$ reaches the ground GND.

Thus, in the output circuit of FIG. 3, since the output voltage $V_{out}$ reaches the ground GND at a relatively low speed, the ground bounce can be suppressed. In this case, since the falling speed of the output voltage $V_{out}$ from time $t_1$ to time $t_2$ is still relatively high, the transition time of the output voltage $V_{out}$ from high to low is not so large.

Figure 5:
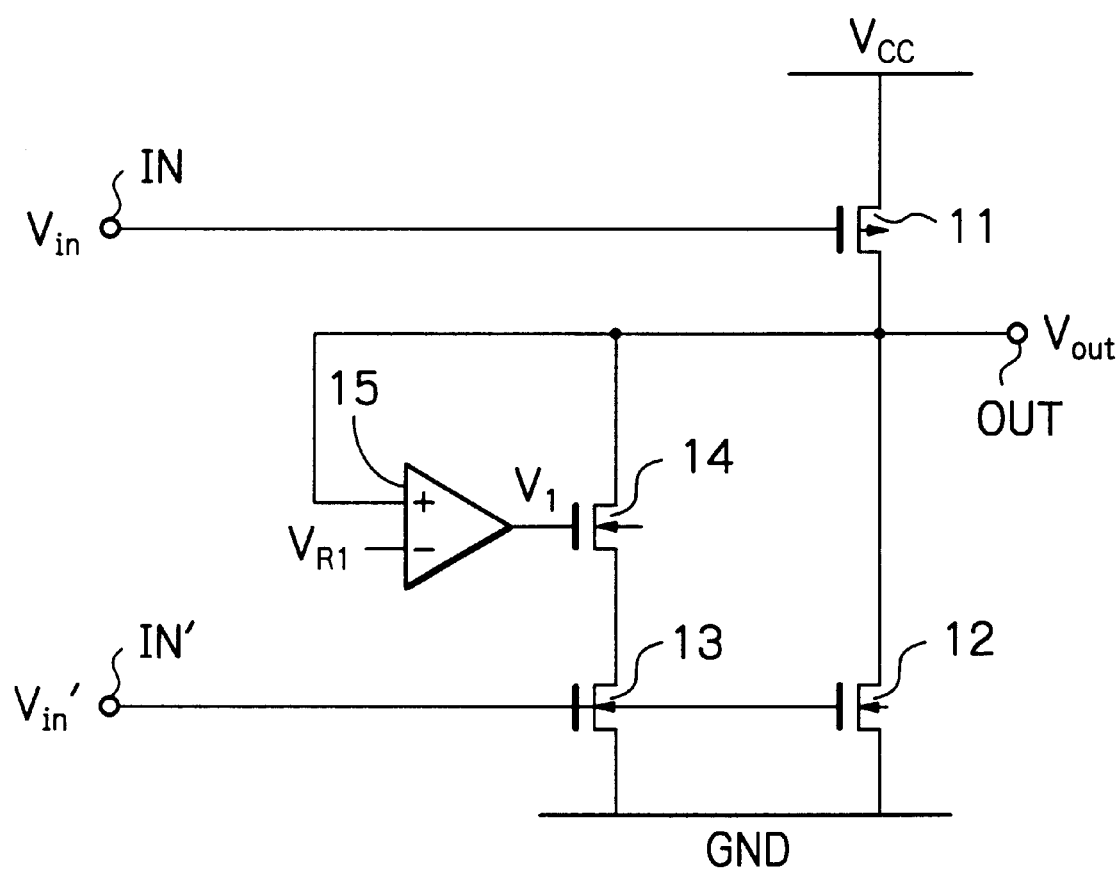
FIG. 5 is a circuit diagram illustrating a modification of the output circuit of FIG. 3.

In FIG. 5, which is a modification of the output circuit of FIG. 3, an input voltage $V_{in}'$ is supplied from an input terminal IN' to the N-channel MOS transistors 12 and 13 while the input voltage $V_{in}$ is supplied from the input terminal IN to the P-channel MOS transistor 11. In this case, the output circuit of FIG. 5 can be in a high impedance state by causing the input voltage $V_{in}$ and $V_{in}'$ to be high and low, respectively.

Figure 6:
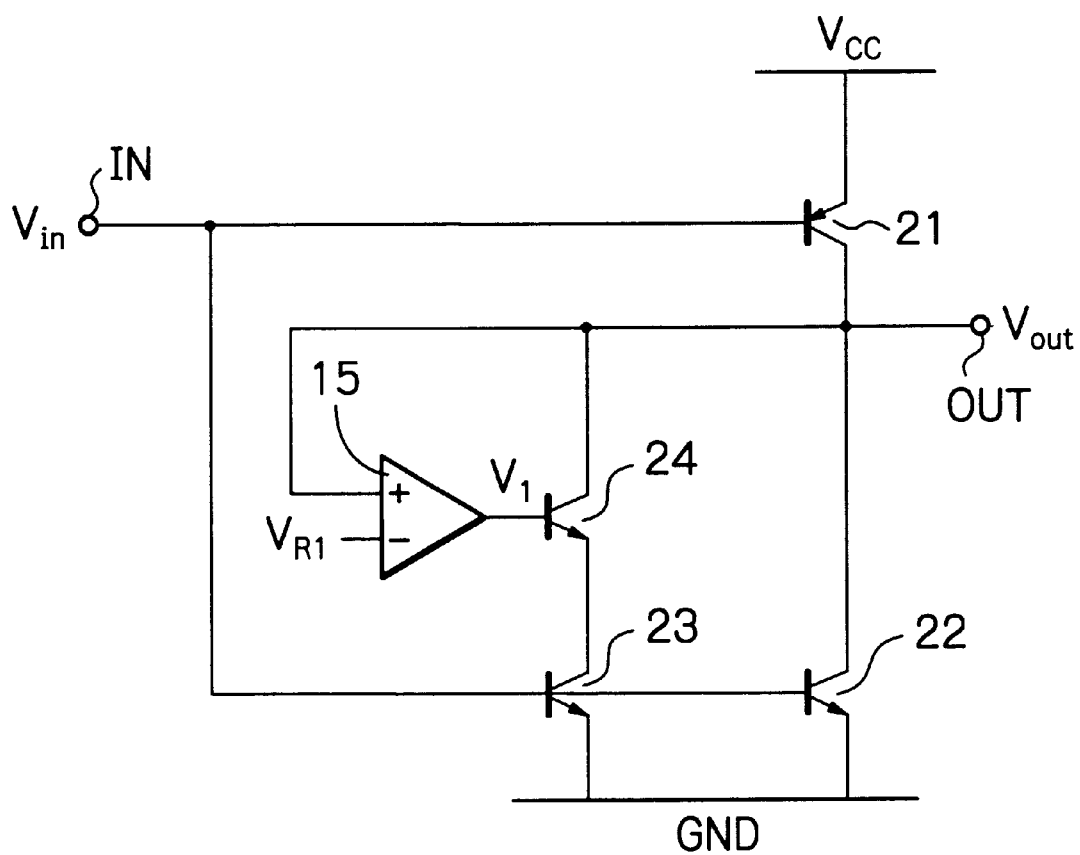
FIG. 6 is a circuit diagram illustrating a second embodiment of the output circuit according to the present invention.

In FIG. 6, which illustrates a second embodiment of the present invention, a PNP-type transistor 21 is provided instead of the P-channel MOS transistor 11 of FIG. 3, and NPN-type transistors 22, 23 and 24 are provided instead of the N-channel MOS transistors 12, 13 and 14, respectively, of FIG. 3.

The operation of the output circuit of FIG. 6 is similar to that of the output circuit of FIG. 3. Thus even in the output circuit of FIG. 6 since the output voltage $V_{out}$ reaches the ground GND at a relatively low speed, the ground bounce can be suppressed. In this case, since the falling speed of the output voltage $V_{out}$ from time $t_1$ to time $t_2$ of FIG. 4B is still relatively high, the transition time of the output voltage $V_{out}$ from high to low is not so large.

Figure 7:
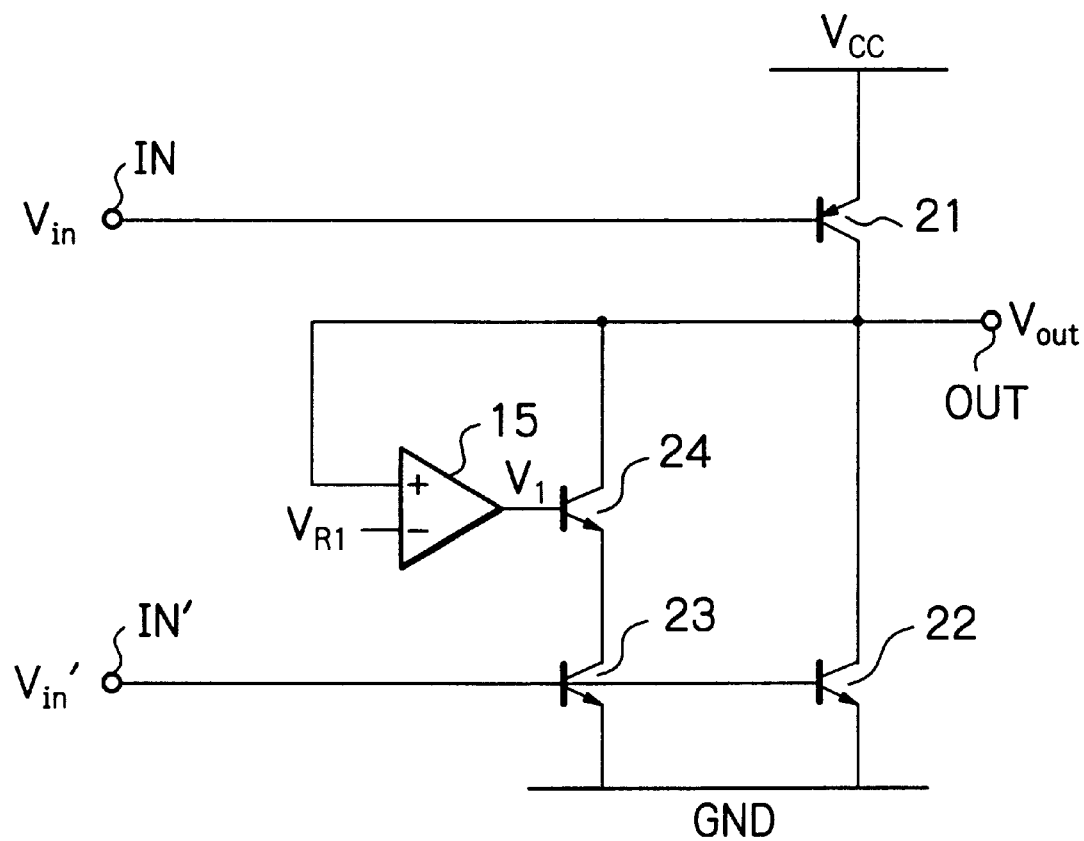
FIG. 7 is a circuit diagram illustrating a modification of the output circuit of FIG. 6.

In FIG. 7, which is a modification of the output circuit of FIG. 6, an input voltage $V_{in}'$ is supplied from an input terminal IN' to the NPN-type transistors 22 and 23 while the input voltage $V_{in}$ is supplied from the input terminal IN to the PNP-type transistor 21. In this case, the output circuit of FIG. 7 can be in a high impedance state by causing the input voltage $V_{in}$ and $V_{in}'$ to be high and low, respectively.

Figure 8:
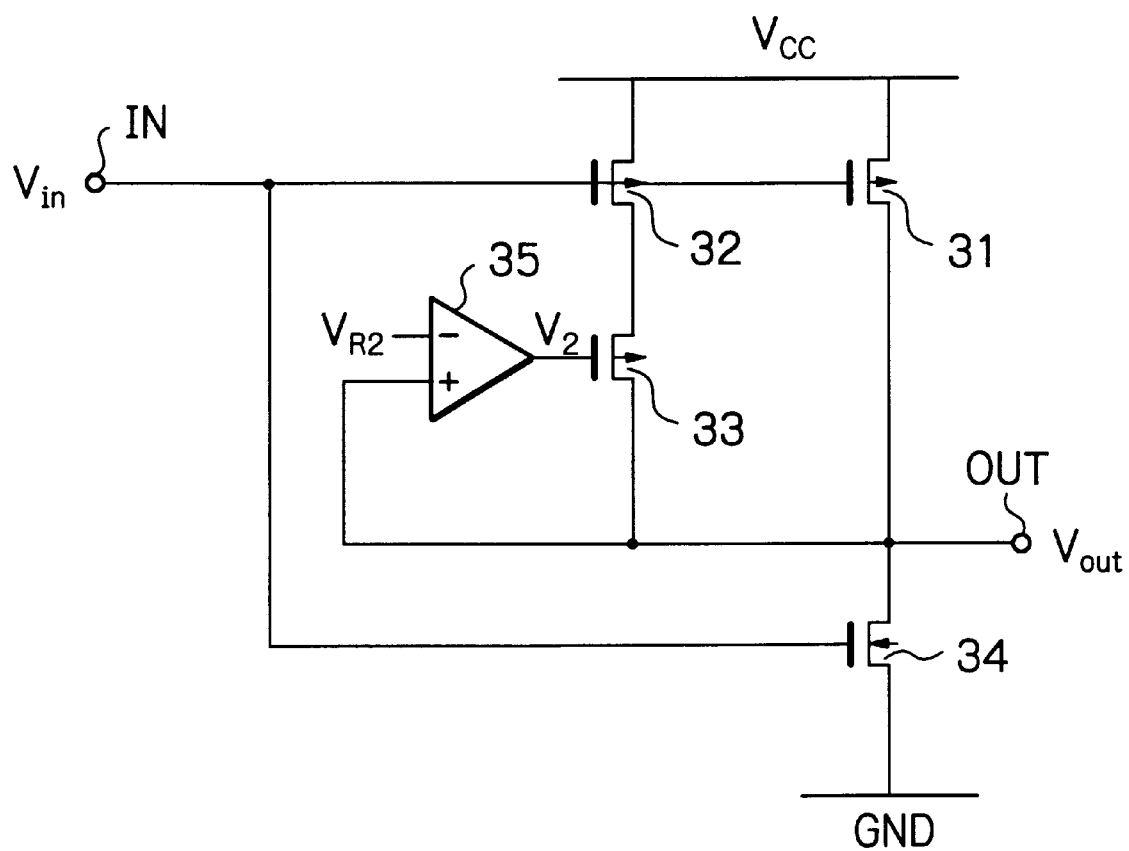
FIG. 8 is a circuit diagram illustrating a third embodiment of the output circuit according to the present invention.

In FIG. 8, which illustrates a third embodiment of the present invention, a P-channel MOS transistor 31 is connected between the power supply terminal $V_{CC}$ and the output terminal OUT, and two P-channel MOS transistors 32 and 33 are connected in series between the power supply terminal $V_{CC}$ and the output terminal OUT. Also, an N-channel MOS transistor 34 is connected between the output terminal OUT and the ground terminal GND. Further, a comparator 35 generates an output voltage $V_2$ control the P-channel MOS transistor 35 in accordance with the output voltage $V_{out}$.

In the comparator 35, when the output voltage $V_{out}$ is higher than a reference voltage $V_{R2}$ such as $V_{CC}/2$, the output voltage $V_2$ is high. On the other hand, when the output voltage $V_{out}$ is not higher than the reference voltage $V_{R1}$, the output voltage $V_2$ is low.

The operation of the output circuit of FIG. 8 will be explained next with reference to FIGS. 9A, 9B and 9C.

Figure 9A:
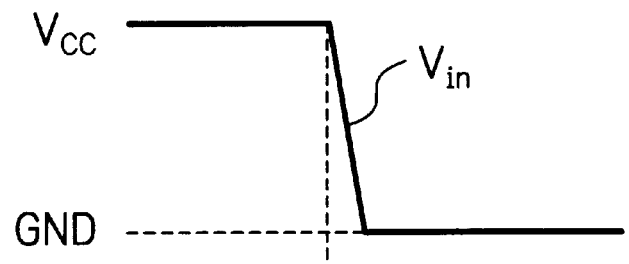
FIGS. 9A, 9B and 9C are timing diagrams showing the operation of the output circuit of FIG. 8.

Before time $t_1$ the input voltage $V_{in}$ is high (=$V_{CC}$) as shown in FIG. 9A. Therefore, the N-channel MOS transistor 34 is turned ON while the P-channel transistors 31 and 32 are turned OFF. As a result, the output voltage $V_{out}$ is low (=GND) as shown in FIG. 9B. In this case, $V_{out}<V_{R2}$, so that the output voltage $V_2$ of the comparator 35 is low (=GND), as shown in FIG. 9C, which turns ON the P-channel MOS transistor 33.

Next, at time $t_1$, the input voltage $V_{in}$ falls as shown in FIG. 9A. Therefore, the P-channel MOS transistors 31 and 32 are turned ON while the N-channel MOS transistor 34 is turned OFF. In this case, the P-channel transistor 33 is still turned ON since the output voltage $V_2$ shows a low level before the output voltage $V_{out}$ reaches $V_{R2}$ as shown in FIGS. 9B and 9C. As a result, the output voltage $V_{out}$ rises relatively quickly as shown in FIG. 9B.

Figure 9B:
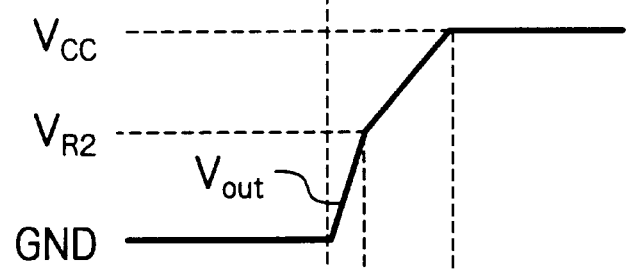
Figure 9C:
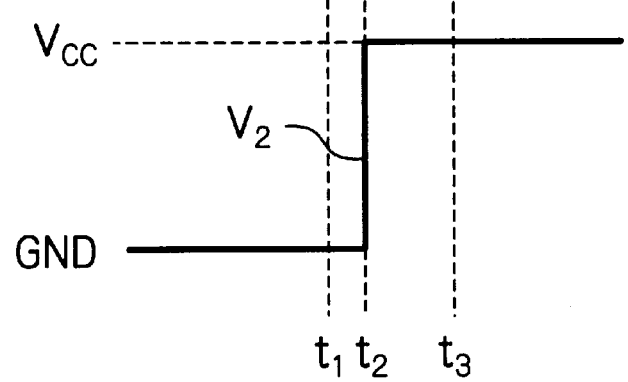

Next, at time $t_2$, the output voltage $V_{out}$ reaches $V_{R2}$ as shown in FIG. 9B, so that the output voltage $V_2$ of the comparator 35 shows a high level as shown in FIG. 9C. Therefore, the P-channel MOS transistor 33 is turned OFF. As a result, the output voltage $V_{out}$ rises relatively slowly as shown in FIG. 9B.

Finally, at time $t_g$, the output voltage $V_{out}$ reaches the power supply voltage $V_{CC}$.

Thus, in the output circuit of FIG. 8, since the output voltage $V_{out}$ reaches the power supply voltage $V_{CC}$ at a relatively low speed, the power supply bounce can be suppressed. In this case, since the rising speed of the output voltage $V_{out}$ from tine $t_1$ to time $t_2$ is still relatively high, the transition time of the output voltage $V_{out}$ from low to high is not so large.

Figure 10:
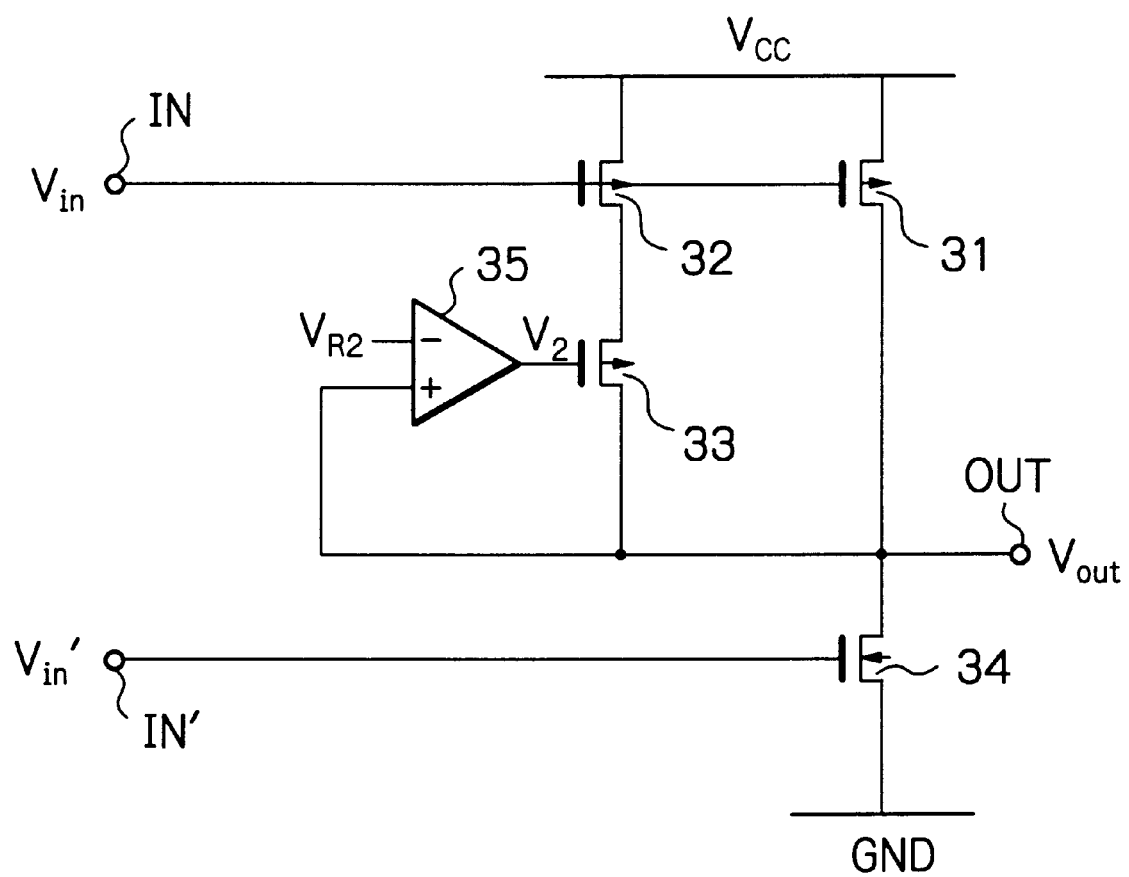
FIG. 10 is a circuit diagram illustrating a modification of the output circuit of FIG. 8.

In FIG. 10, which is a modification of the output circuit of FIG. 8, an input voltage $V_{in}'$ is supplied from an input terminal IN' to the N-channel MOS transistor 34 while the input voltage $V_{in}$ is supplied from the input terminal IN to the P-channel MOS transistors 31 and 32. In this case, the output circuit of FIG. 10 can be in a high impedance state by causing the input voltage $V_{in}$ and $V_{in}'$ to be high and low, respectively.

Figure 11:
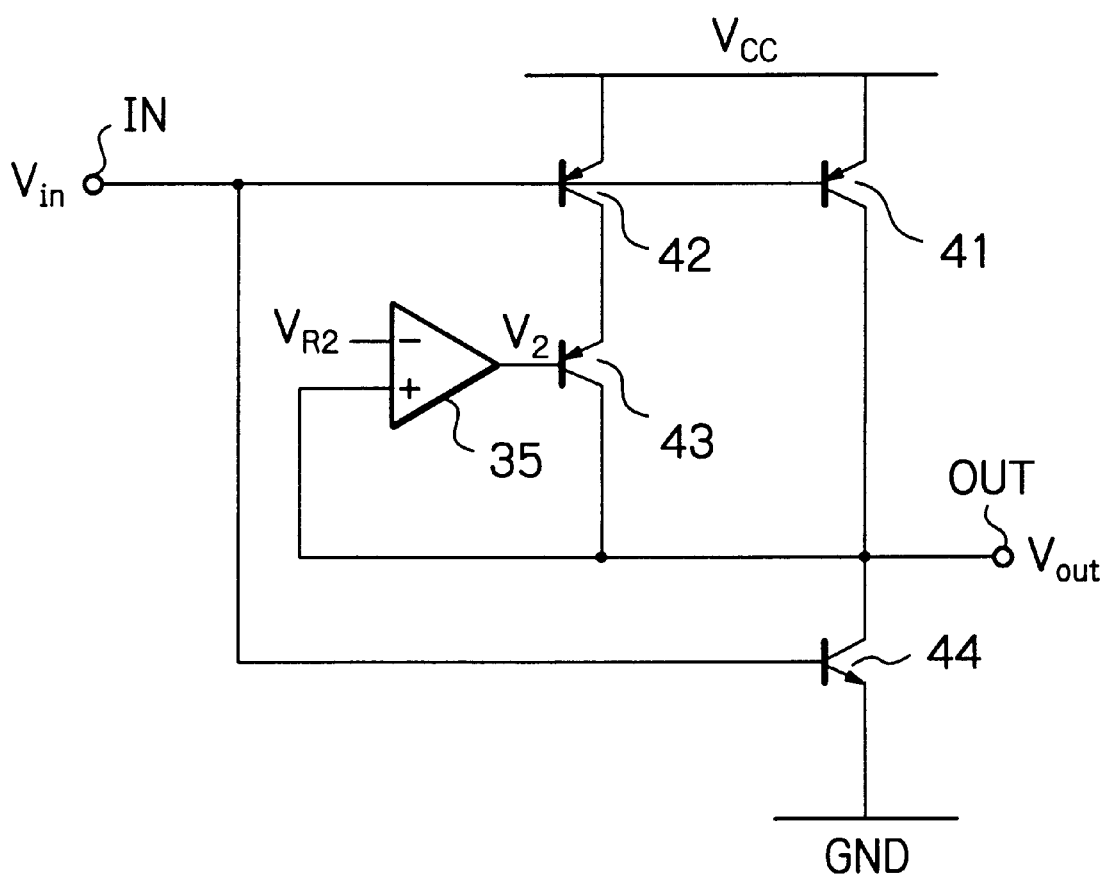
FIG. 11 is a circuit diagram illustrating a fourth embodiment of the output circuit according to the present invention.

In FIG. 11, which illustrates a fourth embodiment of the present invention, PNP-type transistors 41, 42 and 43 are provided instead of the P-channel MOS transistors 31, 32 and 33, respectively, of FIG. 8, and an NPN-type transistor 44 is provided instead of the N-channel MOS transistor 34 of FIG. 3.

The operation of the output circuit of FIG. 11 is similar to that of the output circuit of FIG. 8. Thus even in the output circuit of FIG. 11, since the output voltage $V_{out}$ reaches the power supply voltage $V_{CC}$ at a relatively low speed, the power supply bounce can be suppressed. In this case, since the rising speed of the output voltage $V_{out}$ from time $t_1$, $t_0$ time $t_2$ of FIG. 9B is still relatively high, the transition tine of the output voltage $V_{out}$ from low to high is not so large.

Figure 12:
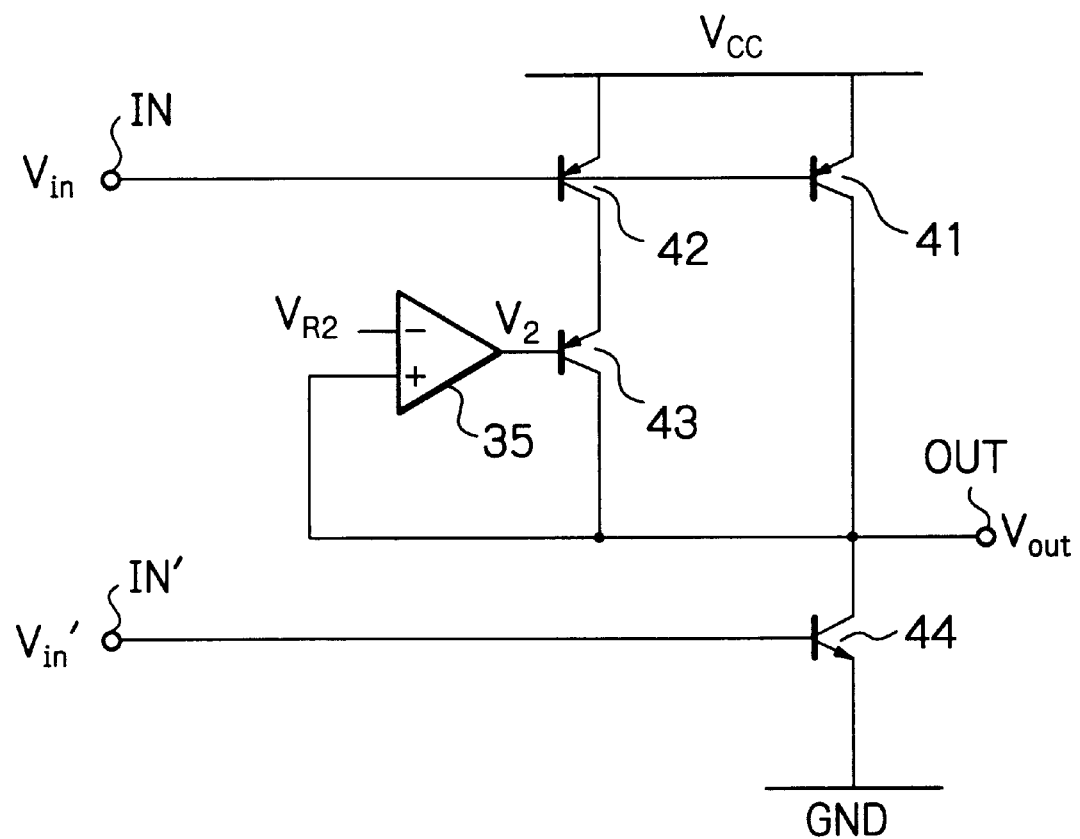
FIG. 12 is a circuit diagram illustrating a modification of the output circuit of FIG. 11.

In FIG. 12, which is a modification of the output circuit of FIG. 11, an input voltage $V_{in}'$ is supplied from an input terminal IN' to the NPN-type transistor 44 while the input voltage $V_{in}$ is supplied from the input terminal IN to the PNP-type transistors 41 and 42. In this case, the output circuit of FIG. 12 can be in a high impedance state by causing the input voltage $V_{in}$ and $V_{in}'$ to be high and low, respectively.

Figure 13:
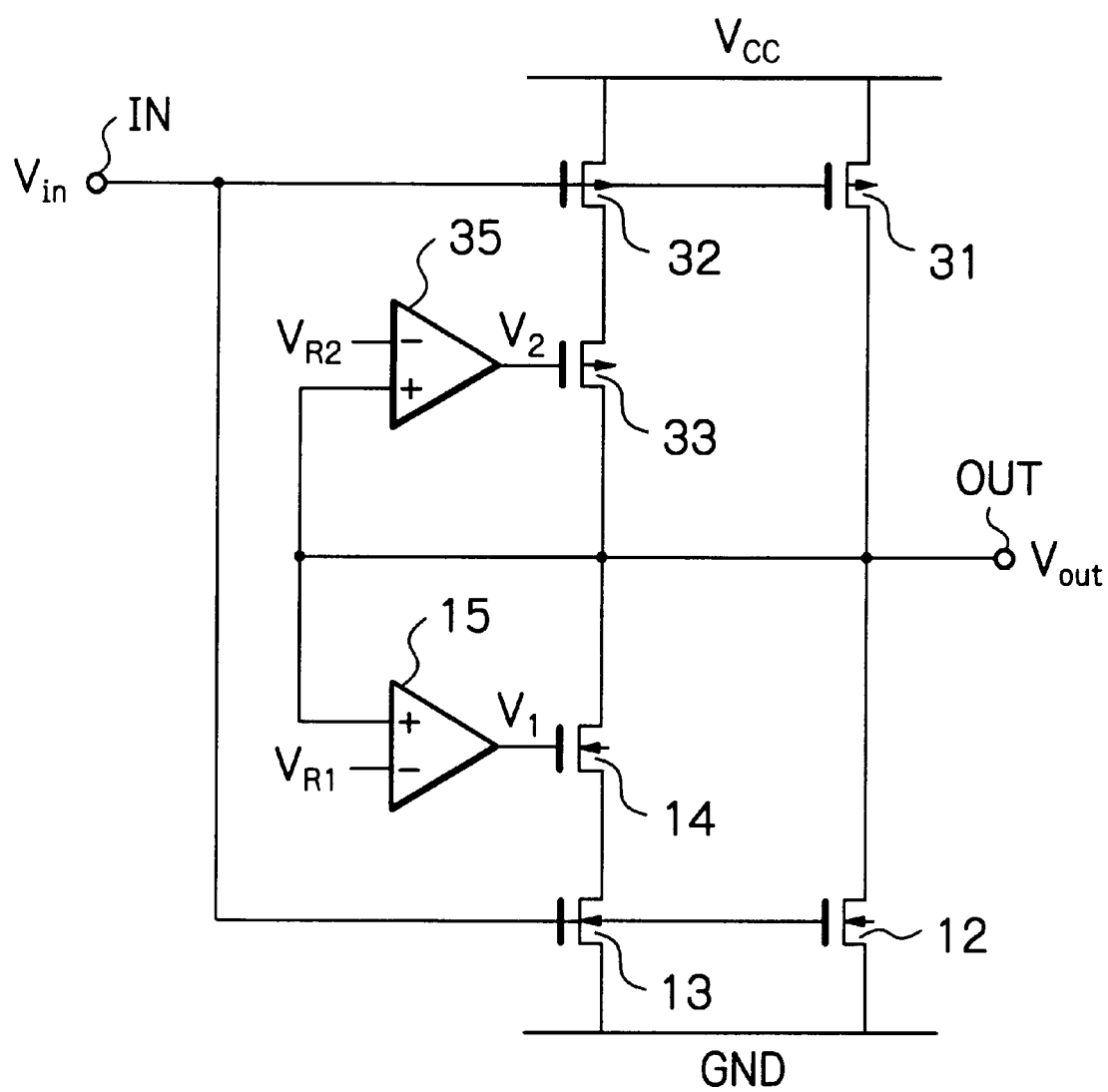

In FIG. 13, which illustrates a fifth embodiment of the present invention, the output circuit of FIG. 3 is combined with that of FIG. 8, thus suppressing both the power supply bounce and the ground bounce.

Figure 14:
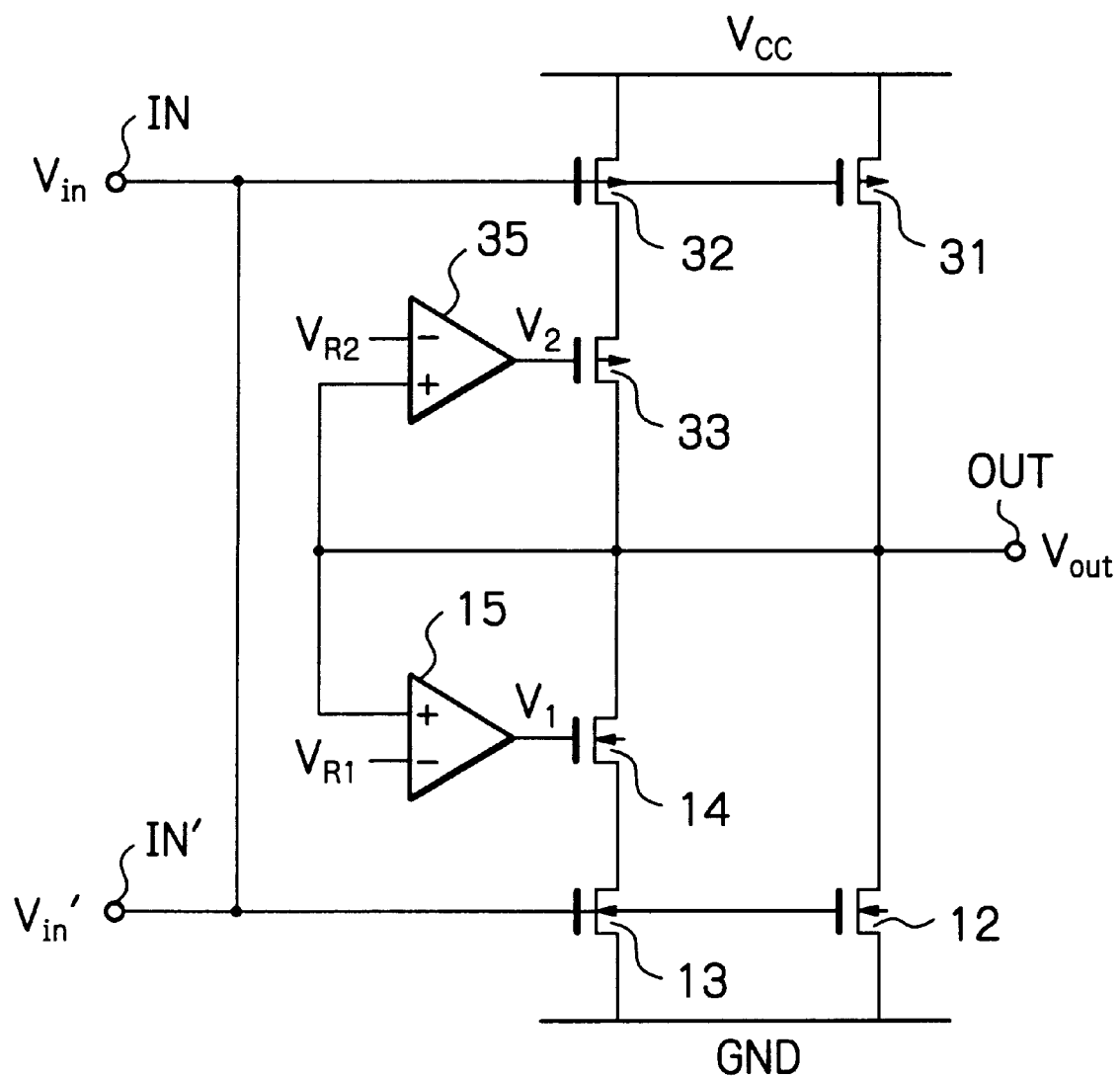

In FIG. 14, which illustrates a sixth embodiment of the present invention, the output circuit of FIG. 5 is combined with that of FIG. 10, thus suppressing both the power supply bounce and the ground bounce.

Figure 15:
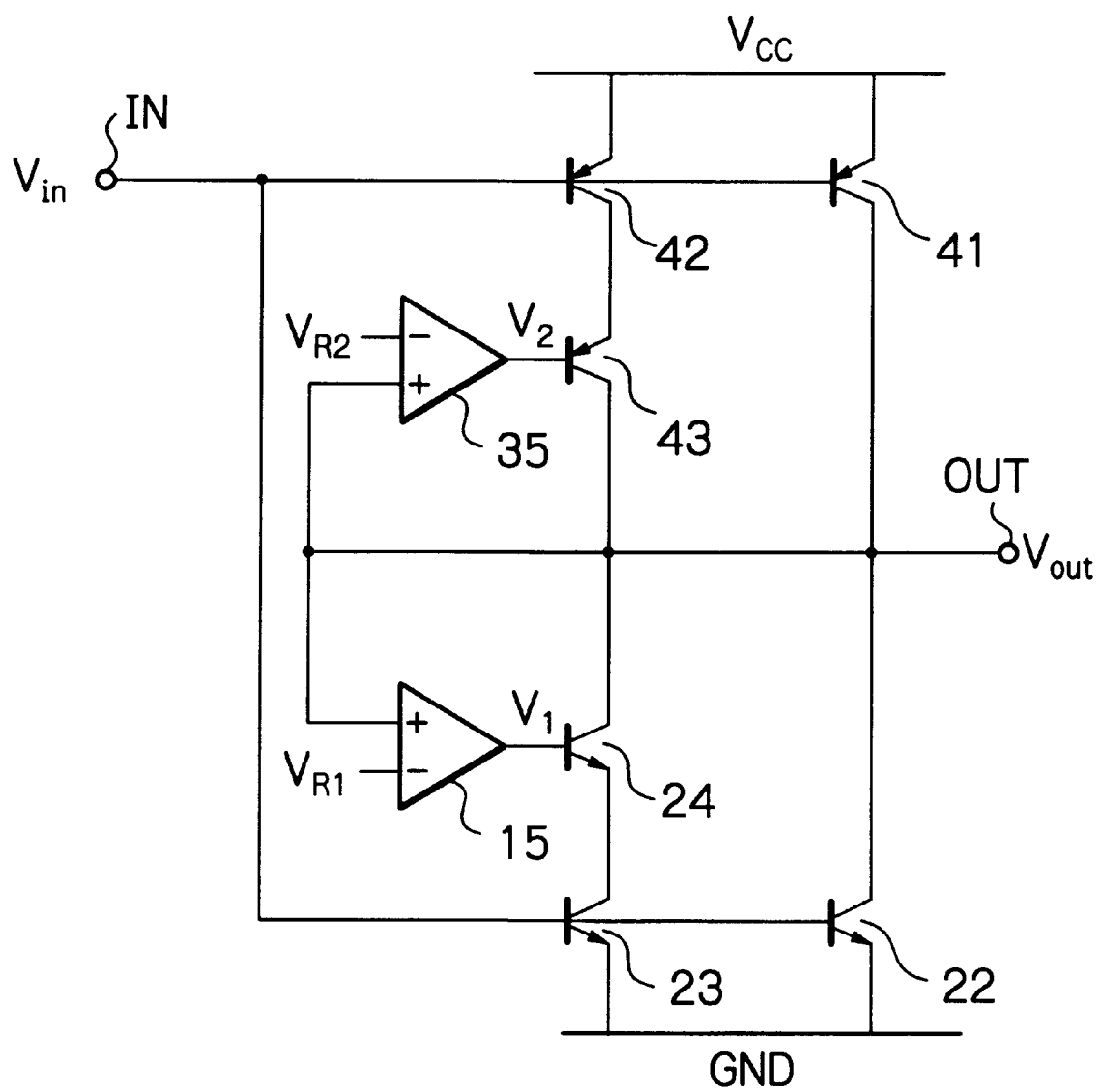

In FIG. 15, which illustrates a seventh embodiment of the present invention, the output circuit of FIG. 6 is combined with that of FIG. 11, thus suppressing both the power supply bounce and the ground bounce.

Figure 16:
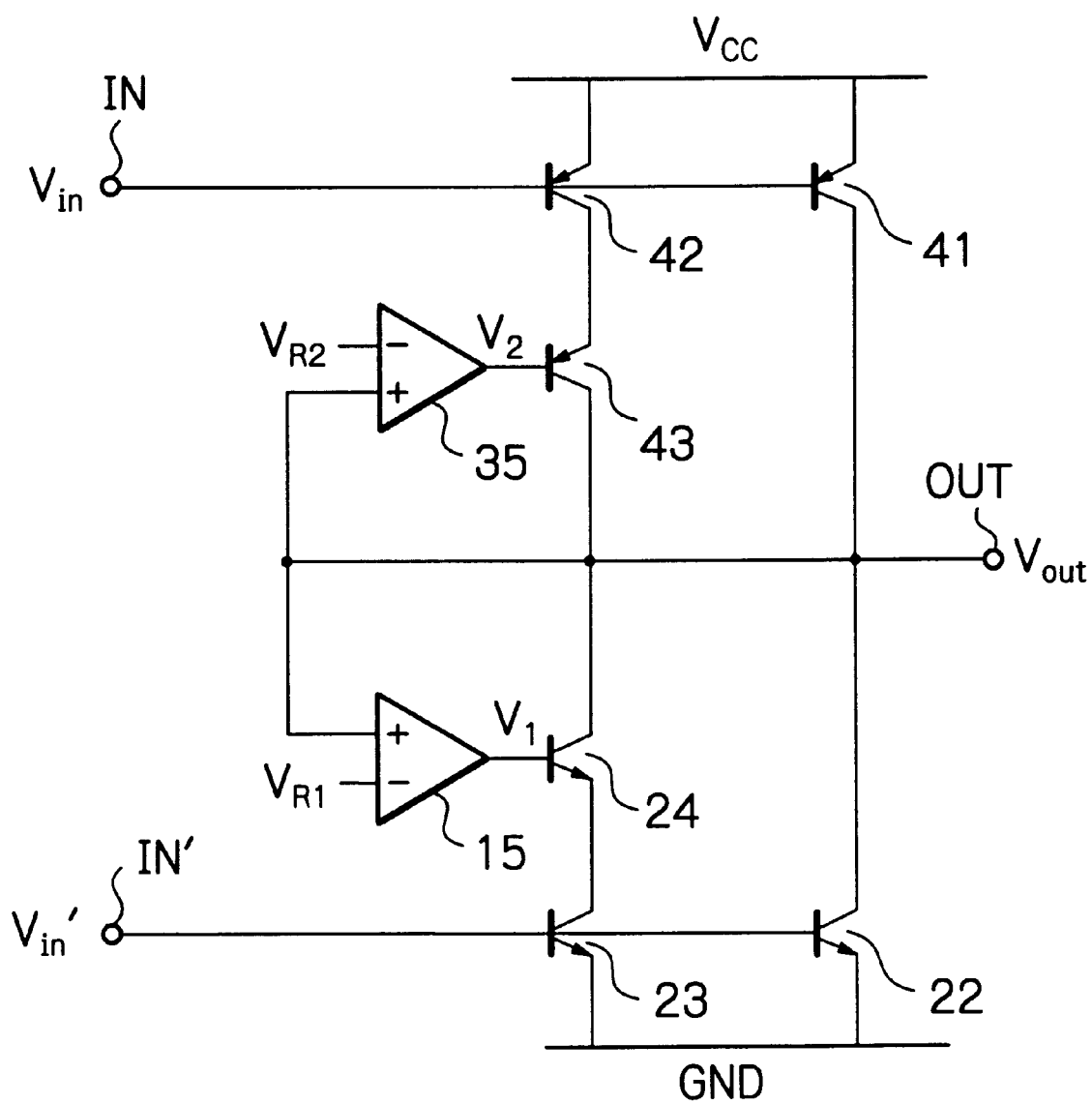

In FIG. 16, which illustrates an eighth embodiment of the present invention, the output circuit of FIG. 7 is combined with that of FIG. 12, thus suppressing both the power supply bounce and the ground bounce.

In FIGS. 3, 5, 13 and 14, note that three or more N-channel MOS transistors in parallel can be provided. Also, in FIGS. 8, 10, 13 and 14, three or more P-channel MOS transistors in parallel can be provided.

Further, in FIGS. 6, 7, 15 and 16, note that three or more NPN-type transistors in parallel can be provided. Also, in FIGS. 11, 12, 15 and 16, three or more PNP-type transistors in parallel can be provided.

Figure 17A:
FIGS. 17A and 17B are circuit diagrams illustrating modifications of FIGS. 13, 14, 15 and 16.
Figure 17B:

Additionally, in FIGS. 13, 14, 15 and 16, if $V_{R1}=V_{R2}=V_{CC}/2$, the comparators 15 and 35 can be constructed by a single comparator as illustrated in FIGS. 17A and 17B.

As explained hereinabove according to the present invention, the power supply bounce and/or the ground bounce can be suppressed without increasing the delay time of the output voltage, so that the generation of error signals can also be suppressed.

What is claimed is:

1. An output circuit comprising:

a first power supply terminal for receiving a first voltage;

a second power supply terminal for receiving a second voltage lower than said first voltage;

an input terminal for receiving an input voltage;

an output terminal for generating an output voltage;

a first switching element connected between said first power supply terminal and said output terminal, said first switching element being controlled by said input voltage;

a plurality of second switching elements connected in parallel between said output terminal and said second power supply terminal, said second switching elements being controlled by said input voltage;

a third switching element connected between said output terminal and one of said second switching elements; and a control circuit, connected to said output terminal, for controlling said third switching element in accordance with said output voltage.

2. The output circuit as forth in claim 1, wherein said control circuit comprises a comparator for comparing said output voltage with a reference voltage between said first and second voltages.

3. The output voltage as set forth in claim 2, wherein said comparator turns ON said third switching element when said output voltage is higher than said reference voltage, said comparator turning OFF said third switching element when said output voltage is not higher than said reference voltage.

4. The output circuit as set forth in claim 1, wherein said first switching element comprises a P-channel MOS transistor, each of said second switching elements comprising an N-channel MOS transistor, said third switching element comprising an N-channel MOS transistor.

5. The output circuit as set forth in claim 1, wherein said first switching element comprises a PNP-type transistor, each of said second switching elements comprising an NPN-type transistor, said third switching element comprising an NPN-type transistor.

6. An output circuit comprising:

a first power supply terminal for receiving a first power supply voltage;

a second power supply terminal for receiving a second power supply voltage lower than said first power supply voltage;

first and second input terminals for receiving first and second input voltages, respectively;

an output terminal for generating an output voltage;

a first switching element connected between said first power supply terminal and said output terminal, said first switching element being controlled by said first input voltage;

a plurality of second switching elements connected in parallel between said output terminal and said second power supply terminal, said second switching elements being controlled by said second input voltage;

a third switching element connected between said output terminal and one of said second switching elements; and a control circuit, connected to said output terminal, for controlling said third switching element in accordance with said output voltage.

7. The output circuit as forth in claim 6, wherein said control circuit comprises a comparator for comparing said output voltage with a reference voltage between said first and second voltages.

8. The output voltage as set forth in claim 7, wherein said comparator turns ON said third switching element when said output voltage is higher than said reference voltage, said comparator turning OFF said third switching element when said output voltage is not higher than said reference voltage.

9. The output circuit as set forth in claim 6, wherein said first switching element comprises a P-channel MOS transistor, each of said second switching elements comprising an N-channel MOS transistor, said third switching element comprising an N-channel MOS transistor.

10. The output circuit as set forth in claim 6, wherein said first switching element comprises a PNP-type transistor, each of said second switching elements comprising an NPN-type transistor, said third switching element comprising an NPN-type transistor.

11. An output circuit comprising:

a first power supply terminal for receiving a first voltage;

a second power supply terminal for receiving a second voltage lower than said first voltage;

an input terminal for receiving an input voltage;

an output terminal for generating an output voltage;

a plurality of first switching elements connected in parallel between said first power supply terminal and said output terminal, said first switching elements being controlled by said input voltage;

a second switching element connected between said output terminal and said second power supply terminal, said second switching element being controlled by said input voltage;

a third switching element connected between said output terminal and one of said first switching elements; and a control circuit, connected to said output terminal, for controlling said third switching element in accordance with said output voltage.

12. The output circuit as forth in claim 11, wherein said control circuit comprises a comparator for comparing said output voltage with a reference voltage between said first and second voltages.

13. The output voltage as set forth in claim 12, wherein said comparator turns ON said third switching element when said output voltage is lower than said reference voltage, said comparator turning OFF said third switching element when said output voltage is not lower than said reference voltage.

14. The output circuit as set forth in claim 11, wherein each of said first switching elements comprises a P-channel MOS transistor, said second switching element comprising an N-channel MOS transistor, said third switching element comprising a P-channel MOS transistor.

15. The output circuit as set forth in claim 11, wherein each of said first switching elements comprises a PNP-type transistor, said second switching element comprising an NPN-type transistor, said third switching element comprising a PNP-type transistor.

16. An output circuit comprising:

a first power supply terminal for receiving a first power supply voltage;

a second power supply terminal for receiving a second power supply voltage lower than said first power supply voltage;

first and second input terminals for receiving first and second input voltage, respectively;

an output terminal for generating an output voltage;

a plurality of first switching elements connected in parallel between said first power supply terminal and said output terminal, said first switching element being controlled by said first input voltage;

a second switching element connected between said output terminal and said second power supply terminal, said second switching element being controlled by said second input voltage;

a third switching element connected between said output terminal and one of said first switching elements; and a control circuit, connected to said output terminal, for controlling said third switching element in accordance with said output voltage.

17. The output circuit as forth in claim 16, wherein said control circuit comprises a comparator for comparing said output voltage with a reference voltage between said first and second voltages.

18. The output voltage as set forth in claim 17, wherein said comparator turns ON said third switching element when said output voltage is lower than said reference voltage, said comparator turning OFF said third switching element when said output voltage is not lower than said reference voltage.

19. The output circuit as set forth in claim 16, wherein each of said first switching elements comprises a P-channel MOS transistor, said second switching element comprising an N-channel MOS transistor, said third switching element comprising a P-channel MOS transistor.

20. The output circuit as set forth in claim 16, wherein each of said first switching elements comprises a PNP-type transistor, said second switching element comprising an NPN-type transistor, said third switching element comprising a PNP-type transistor.

21. An output circuit comprising;

a first power supply terminal for receiving a first voltage;

a second power supply terminal for receiving a second voltage lower than said first voltage;

an input terminal for receiving an input voltage;

an output terminal for generating an output voltage;

a plurality of first switching elements connected in parallel between said first power supply terminal and said output terminal, said first switching elements being controlled by said input voltage;

a plurality of second switching elements connected in parallel between said output terminal and said second power supply terminal, said second switching elements being controlled by said input voltage;

a third switching element connected between said output terminal and one of said first switching elements;

a fourth switching element connected between said output terminal and one of said second switching elements;

a first control circuit, connected to said output terminal, for controlling said third switching element in accordance with said output voltage; and a second control circuit, connected to said output terminal, for controlling said fourth switching element in accordance with said output voltage.

22. The output circuit as forth in claim 21, wherein said first control circuit comprises a first comparator for comparing said output voltage with a first reference voltage between said first and second voltages, said second control circuit comprising a second comparator for comparing said output voltage with a second reference voltage between said first and second voltages.

23. The output voltage as set forth in claim 22, wherein said first comparator turns ON said third switching element hen said output voltage is lower than said first reference voltage, said first comparator turning OFF said third switching element when said output voltage is not lower than said first reference voltage, said second comparator turning ON said fourth switching element when said output voltage is higher than said second reference voltage, said second comparator turning OFF said fourth switching element when said output voltage is not higher than said second reference voltage.

24. The output circuit as set forth in claim 21, wherein each of said first switching elements comprises a P-channel MOS transistor, each of said second switching elements comprising an N-channel MOS transistor, said third switching element comprising a P-channel MOS transistor.

said fourth switching element comprising an N-channel MOS transistor.

25. The output circuit as set forth in claim 21, wherein each of said first switching elements comprises a PNP-type transistor, each of said second switching elements comprising an NPN-type transistor, said third switching element comprising a PNP-type transistor.

said fourth switching element comprising an NPN-type transistor.

26. The output circuit as set forth in claim 21, wherein said first and second comparators are constructed by a single comparator.

27. An output circuit comprising:

a first power supply terminal for receiving a first power supply voltage;

a second power supply terminal for receiving a second power supply voltage lower than said first power supply voltage;

first and second input terminals for receiving first and second input voltages, respectively;

an output terminal for generating an output voltage;

a plurality of first switching elements connected in parallel between said first power supply terminal and said output terminal, said first switching elements being controlled by said first input voltage;

a plurality of second switching elements connected in parallel between said output terminal and said second power supply terminal, said second switching elements being controlled by said second input voltage;

a third switching element connected between said output terminal and one of said first switching elements;

a fourth switching element connected between said output terminal and one of said second switching element;

a first control circuit, connected to said output terminal, for controlling said third switching element in according with said output voltage; and a second control circuit, connected to said output terminal, for controlling said fourth switching element in according with said output voltage.

28. The output circuit as forth in claim 27, wherein said first control circuit comprises a first comparator for comparing said output voltage with a first reference voltage between said first and second voltages, said second control circuit comprising a second comparator for comparing said output voltage with a second reference voltage between said first and second voltages.

29. The output voltage as set forth in claim 28, wherein said comparator turns ON said third switching element when said output voltage is lower than said first reference voltage, said first comparator turning OFF said third switching element when said output voltage is not lower than said first reference voltage, said second comparator turning ON said fourth switching element when said output voltage is higher than said second reference voltage, said second comparator turning OFF said fourth switching element when said output voltage is not higher than said second reference voltage.

30. The output circuit as set forth in claim 27, wherein each of said first switching elements comprises a P-channel MOS transistor, each of said second switching elements comprising an N-channel MOS transistor, said third switching element comprising a P-channel MOS transistor, said fourth switching element comprising an N-channel MOS transistor.

31. The output circuit as set forth in claim 27, wherein each of said first switching elements comprises a PNP-type transistor, each of said second switching elements comprising an NPN-type transistor, said third switching element comprising a PNP-type transistor, said fourth switching element comprising an NPN-type transistor.

32. The output circuit as set forth in claim 27, wherein said first and second comparators are constructed by a single comparator.

* * * * *